United States Patent [19]

Ceraso

[11] Patent Number: 5,688,352

[45] Date of Patent: *Nov. 18, 1997

[54] PROCESS FOR MAKING OF PLASTIC LAMINATES EACH HAVING A METAL LAMINA ON EACH OF TWO OPPOSITE SIDE SURFACES, ESPECIALLY FOR PRINTED CIRCUITS

[75] Inventor: Bruno Ceraso, Milan, Italy

[73] Assignee: Cedal S.R.L., Milan, Italy

[*] Notice: The term of this patent shall not extend beyond the expiration date of Pat. No. 5,615,470.

[21] Appl. No.: 500,985

[22] PCT Filed: Mar. 31, 1993

[86] PCT No.: PCT/IT93/00030

§ 371 Date: Jul. 24, 1995

§ 102(e) Date: Jul. 24, 1995

[87] PCT Pub. No.: WO94/17976

PCT Pub. Date: Aug. 18, 1994

[30] Foreign Application Priority Data

Oct. 2, 1993 [IT] Italy ................ MI93A0224

[51] Int. Cl.$^6$ ................ B32B 31/00
[52] U.S. Cl. ........... 156/228; 156/269; 156/272.2; 156/583.1; 100/93 P
[58] Field of Search ................ 156/228, 499, 156/580, 583.1, 583.5, 250, 269, 272.2; 100/93 P

[56] References Cited

U.S. PATENT DOCUMENTS

| | | | |
|---|---|---|---|
| 3,409,942 | 11/1968 | Siempelkamp | 100/194 |
| 3,592,993 | 7/1971 | Bennett | 219/93 |
| 3,826,601 | 7/1974 | Hutter | 425/338 |
| 3,860,381 | 1/1975 | Pesch | 425/338 |
| 3,969,117 | 7/1976 | Doran et al. | 156/288 |

*Primary Examiner*—James Sells
*Attorney, Agent, or Firm*—Michael J. Striker

[57] ABSTRACT

In the process for making plastic laminates a stack of prepreg bodies is provided with electrically insulated rigid flattening sheets between each pair of adjacent prepreg bodies. Two continuous metal bands are passed in a serpentine manner back and forth through the stack from one side to the other, while being spaced from each other, so that each metal band contacts only one side surface of each prepreg body and the bends formed in each of the two metal bands are distributed on opposite sides of the stack. After the stack is formed with the metal bands passing through it, an electric current is passed through both metal bands from one end of each band to its opposite end to heat the two metal bands and thus the prepreg bodies and pressure is applied to the stack. After heating and pressing the stack, the two metal bands are cut through at the bends to form the plastic laminates.

11 Claims, 1 Drawing Sheet

PROCESS FOR MAKING OF PLASTIC LAMINATES EACH HAVING A METAL LAMINA ON EACH OF TWO OPPOSITE SIDE SURFACES, ESPECIALLY FOR PRINTED CIRCUITS

CROSS-REFERENCE

The instant invention is related to that described in copending U.S. patent application Ser. No. 08/331,661, filed Nov. 7, 1994, in which a method of making a plastic laminate with one metal lamina on one side is described and claimed.

BACKGROUND OF THE INVENTION

The invention concerns processes for making plastic laminates with metal laminae, wherein each of the plastic laminates has a metal lamina on each of two opposing side surfaces.

In the normal way plastic laminates consist of several layers, associated with each other generally by pressing, and comprising plastic materials on a base of paper, fiber glass, fabrics or other materials.

The plastic materials may comprising phenol, melamine, epoxy, polyester, silicon, fluoride or others.

In the production of printed circuits a metal lamina, especially of copper, is made to adhere on one or both sides of the circuit during the pressing process.

A stack of substantially similar units is formed, each of which comprises a number of sheets impregnated with plastic materials with the copper laminae placed outermost. A sheet of metal such as stainless steel or some other is placed between each unit and the stack of unit is put in a multiplate press which applies heat and pressure simultaneously.

At the close of the heating cycle, which includes a cooling stage, a compact and rigid product is obtained whose individual components are closely associated together. Presses suitable for this kind of production are complex and give a low output because of having many plates, of having to produce heat and pressure at the same time and in well defined and precise sequences, because of having to create, by conduction, even temperatures in the various units in the stack of which, obviously, only those at the top and bottom of the stack are in contact with the heating plates.

The presence of many heating plates not only complicates the structure of the press but also makes unit loading and unloading a lengthy operation, while problems occur over short production runs because of the difficulties of amortizing costs.

In particular, the penetration of heat from the plates through the stack is hindered because of the distance it must travel to reach the innermost unit or prepreg body. These difficulties result in high costs, for the press itself and for running it, in waste of materials, in long processing times and therefore in a more costly product. The invention here presented greatly lessens the above drawbacks while offering considerable advantages as will be explained below.

SUMMARY OF THE INVENTION

It is an object of the present invention to provide an improved process for making plastic laminates, especially those for printed circuits, with a metal lamina on each of two opposing side surfaces or faces of each laminate by the formation of a stack of prepreg bodies comprising a high-insulation plate, of prepreg or another material, and comprising a plurality of prepreg sheets or layers impregnated with plastic material.

Sheets of stainless steel or other material, hereinafter called flattening sheets are placed between each adjacent pair of prepreg bodies.

The process for makin plastic laminates according to the invention comprises the steps of:

a) stacking the prepreg bodies, one on top of the other, so that each pair of adjacent prepreg bodies has two opposing side surfaces facing each other;

b) passing a first metal band and a second metal band in a serpentine manner back and forth through the resulting stack of prepreg bodies with the first metal band and the second metal band spaced from each other to form a number of bends in both metal bands on opposite sides of the stack;

c) arranging each prepreg body in the stack between the first and second metal band so that the first metal band contacts on one side surface of each prepreg body and the second metal band contacts on the other remaining side surface of each prepreg body;

d) arranging a rigid flattening sheet provided with an electrically insulating layer covering each of two opposite sides between each pair of adjacent prepreg bodies and, at the same time, between opposing portions of the metal bands between that pair of adjacnet prepreg bodies;

e) passing an electric current through both metal bands from one end of each of the bands to an opposite end thereof to heat the first and second metal bands and thus the prepreg bodies and the rigid flattening sheets with the insulating layers; and f) applying pressure to the stack of the prepreg bodies and the rigid flattening sheets.

Thus, when adequate pressure is applied to the stack of prepreg bodies and on closing the generator's electric circuit, the various sections of the two bands, matching respectively with the two faces of the packages, will act as electric heating elements causing close association among the different layers of the prepreg bodies and the formation of plastic laminates.

Layers or other equivalent means giving a high degree of electrical insulation, are placed between the sheets and continuous bands.

Preferably the bands are made of copper.

In one preferred embodiment the ends of the two bands appear on the same side of the stack for easier connection to the generator of electricity.

Advantageously each of the two bands make their 180° bends alternatively on one side of the stack of prepreg bodies and on the opposite side.

Pressure on the stack of prepreg bodies may be provided in preferred embodiments of the process by placing the stack in a cold press or in an autoclave.

In one embodiment the stack is put into a die having a plate at the top and bottom connected by supporting and guiding pins.

The pressure required for the process is obtained by placing this die in a cold press or in an autoclave.

The invention clearly possesses advantages.

There being no need for the press to provide both the heat and pressure, it can be a simple one and the press can be any of many kinds and of different power capacities according to the type of laminate required as long as it can produce sufficient pressure.

Heat is delivered directly to each prepreg body so that the temperature of all parts of the stack rises uniformly in a short time.

Heating is much quicker compared with that obtainable from present presses in which it has to penetrate some distance before reaching the interior of the stack of prepreg bodies.

By using a mixed form of heating, combining the traditional type of heating plates at each end of the stack of prepreg bodies with the two metal bands passing in a serpentine manner back and forth through the stack, processing times are much shorter and productivity is consequently much higher. Work sequences are not only faster but are also simpler reducing waste and therefore appreciably lowering costs.

BRIEF DESCRIPTION OF THE DRAWING

The objects, features and advantages of the invention will now be illustrated in more detail with the aid of the following description of the preferred embodiments, with reference to the accompanying figures in which:

The sole FIGURE is a cross-sectional view showing a cold press and, in the cold press, a stack of prepreg bodies with two copper metal bands passing in a serpentine manner therethrough, which are used in the process of the invention to form the plastic laminates.

Figure 1:
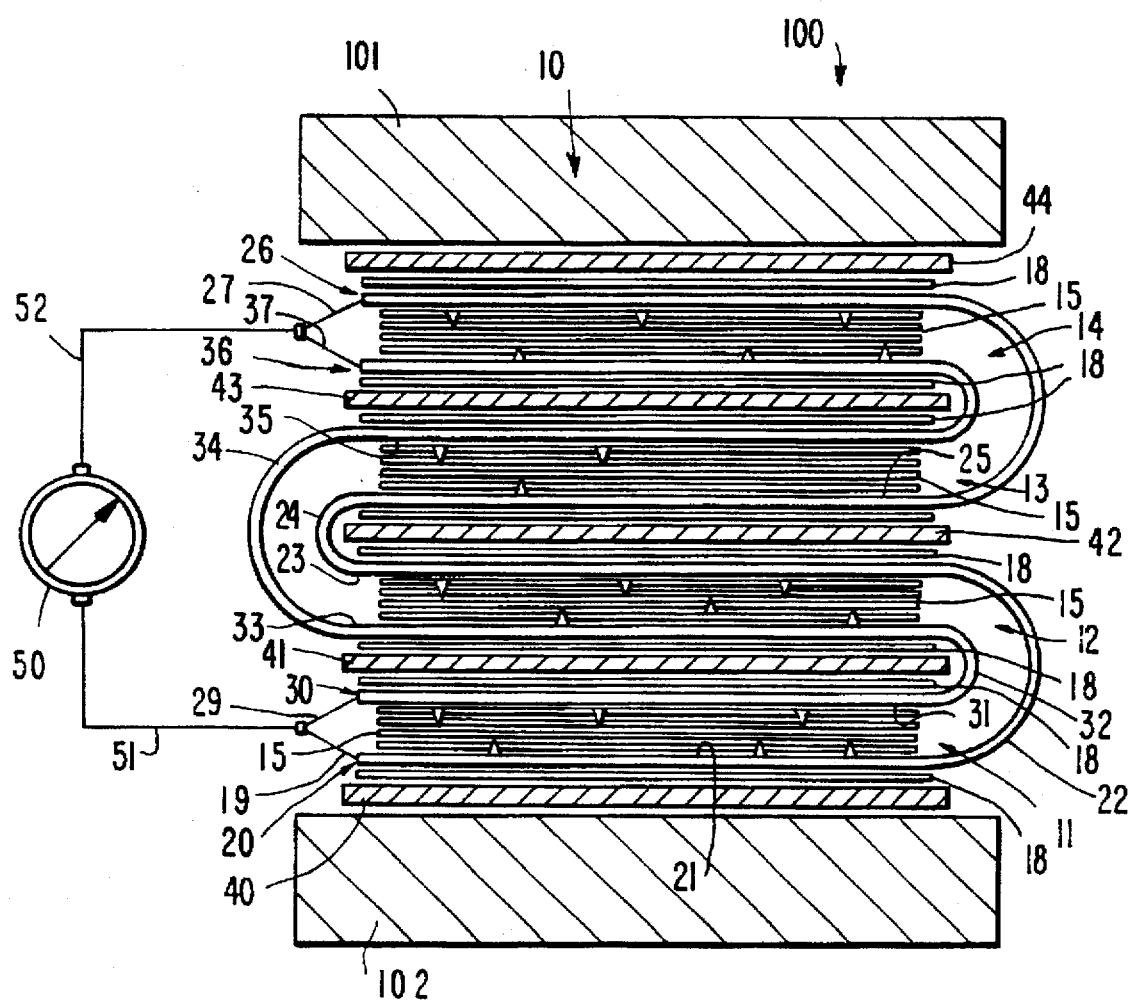

The stack 10, placed between the plates 101, 102 of a press 100, is composed of prepreg bodies 11–14 each comprising prepreg layers 15 of fiber glass fabric impregnated with epoxy resins.

A rigid steel flattening sheet 40–44 with an electrical insulating layer 18 covering each opposite side surface thereof is placed between each pair of adjacent prepreg bodies 11 to 14. The sheet 40, laid on the lower plate 102, has placed upon it a layer 18 of insulating material and on top of this the first section 21 of a first copper band 20. Above this section is the prepreg body 11 and on top of that is the first section 31 of the second copper band 30 and a layer 18 of electrical insulating material.

The sheet 41 and another insulating layer 18 are then placed on this insulating layer 18. After the second band has made a sharp 180° bend 32 the section 33 of the second metal band is applied or placed on the other insulating layer 18.

The second prepreg body 12 is then laid and on this, after making a bend 22 at 180° degrees, the second section 23 of the first band 20 is placed on the prepreg body 12. After another insulating layer 18, a third sheet 42 of stainless steel is laid with another insulating layer on its opposite side surface 18.

The band 20 makes another 180° bend 24 and its third section 25 is arranged over the rigid flattening sheet 42 with the covering insulating layer 18.

After making a second 180° turn 34, the second band 30 is placed with the section 35 following the bend 34 on top of the next prepreg body 13.

Finally the first band 20 appears at the top of the uppermost prepreg body 14 with its end 26 while the second band 30 appears from under it with its end 36.

At the start of stack formation the bands are connected to connector sections 19,29, which, in turn, are electrically connected to lead 51.

The beginning and terminating ends of the bands are connected, by connector sections 19, 29 and 27, 37, respectively with leads 51 and 52, to the generator 50 of electric current.

On starting up the press 100 with simultaneous closure of the electric circuit, the bands 20 and 30 act as electric heating elements and heat reaches the prepreg bodies 11–14 as indicated by the arrows.

The pressing process with heating is then carried out.

I claim:

1. A process for making plastic laminates, each of said plastic laminates comprising a prepreg body having an opposing side surface on each of two opposite sides of the prepreg body and a metal lamina on each of said opposing side surfaces, and each of said prepreg bodies having insulating properties and consisting of a plurality of prepreg layers and including a plastic material, said process comprising the steps of:

a) stacking a plurality of the prepreg bodies, one over the other, so that each pair of adjacent ones of said prepreg bodies has two of said opposing side surfaces of said pair facing each other;

b) passing a first metal band and a second metal band in a serpentine manner back and forth between said prepreg bodies with said first metal band and said second metal band spaced from each other to form a plurality of bends in both said first metal band and in said second metal band, said first and second metal band each having two opposite ends and extending continuously between said two opposite ends;

c) arranging each of said prepreg bodies between the first metal band and the second metal band so that said first metal band contacts on only one of the two opposing side surfaces of each of said prepreg bodies and said second metal band contacts on another of said two opposing side surfaces of each of said prepreg bodies on an opposite side from the one side surface contacted by the first metal band;

d) arranging a rigid flattening sheet provided with an electrically insulating layer covering each of two opposite sides thereof between said adjacent prepreg bodies of each of said pairs and, at the same time, between adjacent sections of said metal bands between said adjacent prepreg bodies to form a stack comprising said prepreg bodies and said rigid flattening sheets with said metal bands passing through said stack in said serpentine manner;

e) passing an electric current through each of the metal bands from one of the opposite ends of each of said metal bands to another of the opposite ends so as to heat the first and second metal bands and thus the prepreg bodies and the rigid flattening sheets with the electrically insulating layers; and f) applying pressure to the stack of the prepreg bodies and the rigid flattening sheets with the electrically insulating layers.

2. The process as defined in claim 1, further comprising, after the passing of the electric current and the applying of the pressure, cutting said metal bands at said bends to form the plastic laminates with a metal lamina in each side thereof.

3. The process as defined in claim 1, wherein the metal bands are made of copper.

4. The process as defined in claim 1, wherein both of said metal bands protrude from a same side of said stack for easier connection with a source of said electric current.

5. The process as defined in claim 1, wherein said bends of said metal bands are distributed on alternate sides of said stack.

6. The process as defined in claim 1, wherein said applying of the pressure occurs with a cold press.

7. The process as defined in claim 1, wherein said applying of the pressure occurs in an autoclave.

8. The process as defined in claim 1, further comprising placing said stack inside a die having an upper and lower plate connected by supporting and guiding pins, placing said die in a cold press and performing said applying of said pressure to the stack by pressing said die in the cold press.

9. The process as defined in claim 1, further comprising placing said stack inside a die having an upper and lower plate connected by supporting and guiding pins, placing said die in an autoclave and performing said applying of said pressure to the stack by operating said autoclave with said die inside the autoclave.

10. The process as defined in claim 1, wherein each of the rigid flattening sheets is a stainless steel sheet.

11. A process for making plastic laminates, each of said plastic laminates comprising a prepreg body having an opposing side surface on each of two opposite sides of the prepreg body and a metal lamina on each of said opposing side surfaces, said prepreg body consisting of a plurality of prepreg layers, including a plastic material and having insulating properties, said process comprising the steps of:

a) providing a stack comprising said prepreg bodies, arranged one over the other, with two metal bands passing in a serpentine manner back and forth through said stack and between the prepreg bodies, said metal bands being spaced from each other, to form a plurality of bends in each of the metal bands distributed on opposite sides of said stack, said two metal bands having two opposite ends and extending continuously between said two opposite ends;

b) passing an electric current through each of the metal bands from one of the opposite ends thereof to another of the opposite ends to heat each of the metal bands and thus the prepreg bodies;

c) applying pressure to the stack comprising the prepreg bodies with the metal bands passing therebetween in a serpentine manner; and d) after steps c) and b), cutting through both of the metal bands at each of said bends to form the plastic laminates.

* * * * *